United States Patent [19]

Hirano et al.

[11] Patent Number: 4,857,996
[45] Date of Patent: Aug. 15, 1989

[54] IMAGE PICKUP DEVICE WITH REDUCED FIXED PATTERN NOISE

[75] Inventors: Yoshiaki Hirano, Kawagoe; Teruo Hieda, Yokohama, both of Japan

[73] Assignee: Canon Kabushiki Kaisha, Tokyo, Japan

[21] Appl. No.: 925,215

[22] Filed: Oct. 31, 1986

[30] Foreign Application Priority Data

Nov. 6, 1985 [JP] Japan .................. 60-249619

[51] Int. Cl.[4] .................. H04N 9/077; H04N 3/15; H04N 5/335
[52] U.S. Cl. .................. 358/48; 358/213.18; 358/213.26; 358/213.28; 358/213.31
[58] Field of Search .................. 358/213.18, 213.15, 358/213.26, 213.27, 213.28, 213.31, 44, 48, 213.29; 377/60, 63, 75

[56] References Cited

U.S. PATENT DOCUMENTS

| | | | |
|---|---|---|---|
| 3,781,574 | 12/1973 | White et al. | 357/24 |
| 4,075,514 | 2/1978 | Sequin | 333/165 |
| 4,274,113 | 6/1981 | Ohba et al. | 358/213.18 |
| 4,513,313 | 4/1985 | Kinoshita et al. | 358/213.29 |
| 4,549,215 | 10/1985 | Levine | 358/213.26 |
| 4,652,766 | 3/1987 | Wang et al. | 250/578 |
| 4,656,503 | 4/1987 | Hynecek | 358/44 |

FOREIGN PATENT DOCUMENTS

| | | | |
|---|---|---|---|
| 81784 | 5/1982 | Japan | 358/213.15 |
| 129883 | 8/1983 | Japan | 358/213.31 |
| 81982 | 5/1985 | Japan | 358/213.15 |

*Primary Examiner*—Edward L. Coles, Sr.
*Assistant Examiner*—Randall S. Svihla
*Attorney, Agent, or Firm*—Fitzpatrick, Cella, Harper and Scinto

[57] ABSTRACT

An image pickup device for generating three pulses 120 degrees out of phase with one another and having the same period, to clamp, sample and hold, and reset an image signal output from an image pickup element. The pulse width of the sample and hold pulse is less than one third of the period. The image signal is read from the image pickup element using three transfer pulses 120 degrees out of phase with one another and having the same period. Each of the transfer pulses is less in width than one third of the period, and also serves as a timing signal for sampling and holding the image signal. In one embodiment, the image pickup device may have three read-out devices for reading out three horizontal lines at one time (not, however, in phase), with a separate train of transfer pulses being used for each of the three lines.

14 Claims, 3 Drawing Sheets

IMAGE PICKUP DEVICE WITH REDUCED FIXED PATTERN NOISE

BACKGROUND OF THE INVENTION

1. Field of the Invention

The present invention relates to an image pickup device and more particularly to a drive apparatus for the image pickup device.

2. Related Background Art

When a solid state image pickup element, for example, a CCD, is used in a television camera, the use of so-called double-correlation sampling of the output circuit of the camera can reduce the reset noise to improve the S/N ratio. In this instance, in the double-correlation sampling circuit, the three (clamp, sample and hold, and reset) pulses are required to have predetermined phase differences among them.

In such a case, if the clamp, sample and hold (hereinafter referred to as the S/H), and reset pulses are used, each being 120 degrees out of phase with the others and each having a duty cycle of ⅓, one pulse will rise while one of the other two pulses is falling. Thus, noise is likely to be mixed into the desired signal during clamping or sampling and holding and a fixed pattern noise, etc., will increase.

SUMMARY OF THE INVENTION

It is an object of the present invention to eliminate such prior art drawbacks.

In order to solve these problems, a first embodiment of the present invention is an image pickup device for generating three pulses, 120 degrees out of phase with one another and having the same period, to clamp, sample and hold, and reset an image signal output from an image pickup element, in which the pulse width of the sample and hold pulse is less than one third of the period.

A second embodiment of the present invention is a image pickup device for reading an image signal using three transfer pulses 120 degrees out of phase with one another, in which each of the transfer pulses is less in width than one third of the period and serves as a timing signal for sampling and holding the image signal.

According to such embodiments of the present invention, the mixing of noise due to other pulses in the signal during sampling and holding is prevented by rendering the pulse width of the sample and hold pulse less than one third of the period.

Other objects and features of the present invention will be apparent from the following detailed description of the preferred embodiments and accompanying drawings.

DETAILED DESCRIPTION OF THE PREFERRED EMBODIMENTS

One embodiment of the present invention will now be described with respect to the drawings.

While one embodiment of the present invention will be described by taking frame transfer type CCD as an image pickup element as an example, it should be noted that the present invention is not limited to such examples. The present invention is also applicable to interline transfer type CCDs and other image pickup devices.

Figure 1:
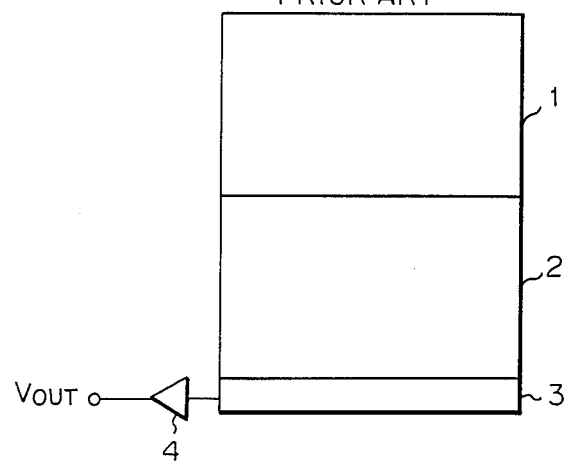
FIG. 1 is a block diagram showing the structure of a frame transfer-type CCD to which the present invention can be applied.

FIG. 1 shows the structure of a frame transfer type CCD. In FIG. 1, an image pickup (photoreceptor) unit 1 produces electric charges is accordance with the incident light and stores them therein. A memory (storage) 2 receives the electric charges produced by unit 1 and stores them temporarily. A horizontal register unit 3 sequentially reads the stored charges in storage 2 in units of a line. An output amplifier 4 is provided on the side of horizontal register unit 3 for converting the charges to a voltage and performing double-correlation sampling.

Figure 2:
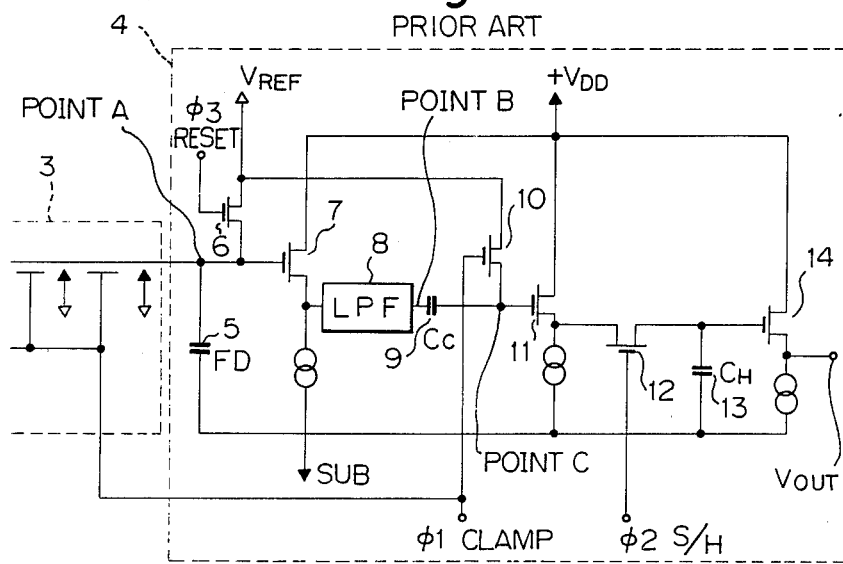
FIG. 2 is a block diagram showing the structure of an output amplifier 4 shown in FIG. 1.

FIG. 2 is a circuit diagram showing the details of output amplifier 4. In FIG. 2, a floating diffusion (hereinafter referred to as the FD) 5 converts the charges transferred by horizontal register 3 to a voltage. A FET 6 constitutes a reset circuit which erases a voltage across FD5. A FET 7 connected to a voltage source $+V_{DD}$ and a current source (which is connected to a circuit substrate) constitutes a source follower which transmits the potential level of FD 5 to the next stage. A low-pass filter (hereinafter referred to as the LPF) 8 delays a source signal from source follower 7 and eliminates white noise occurring int he substrate and high frequency components of a transfer clock. A capacitor Cc or 9 AC-couples the signal delayed by the LPF to the next stage. A clamp circuit 10 clamps the potential of capacitor 9 to a reference potential $V_{REF}$. A FET 11 connected to voltage source $+V_{DD}$ and to a current source, constitutes a source follower which transmits the signal AC-coupled by capacitor 9 to the next stage. A FET 12 charges therethrough a hold capacitor CH 13 with the source potential of source follower 11. A FET 14 connected to voltage source $+V_{DD}$ and current source constitutes a source follower which transmits the potential stored across capacitor CH 13 to the next stage. FETs 12 and 14 and capacitor CH 13 constitute a sample and hold circuit.

Figure 3A:
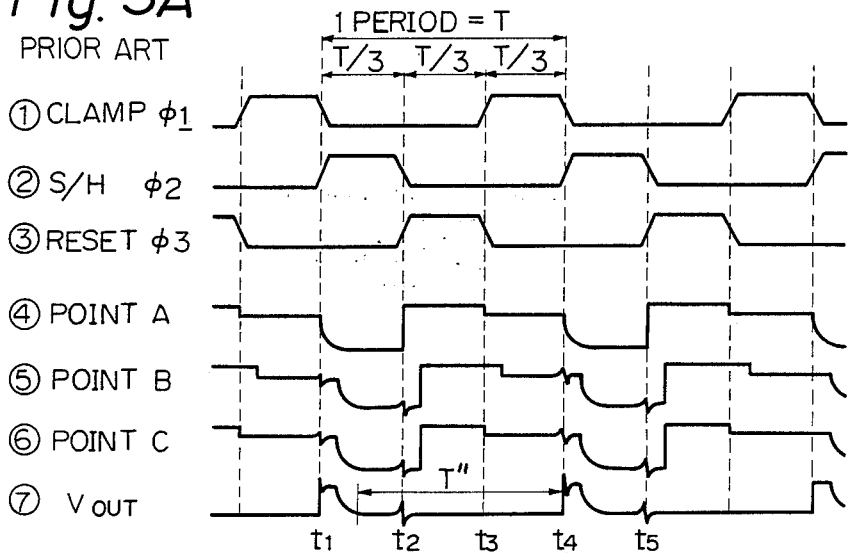
FIG. 3A is a timing chart showing the conventional waveforms of pulses $\phi 1$, $\phi 2$ and $\phi 3$, shown in FIG. 2, for clamping, sampling and holding, and resetting purposes.

In FIG. 2, clamp pulse $\phi 2$ is also applied as a horizontal transfer pulse to horizontal register 3. Clamp, sample and hold, and reset pulses $\phi 1$, $\phi 2$ and $\phi 3$ are applied 120 degrees out of phase with one another. FIG. 3A shows the waveforms of signals at several points of the circuit when the duty cycle of pulses $\phi 1$, $\phi 2$ and $\phi 3$ is ⅓. In FIG. 2, when clamp pulse $\phi 1$ becomes low (t=t1), a signal charge is injected into FD 5 from horizontal register 3 and stored in FD 5 when reset pulse $\phi 3$ becomes high (t=t2). When reset pulse $\phi 3$ becomes high (t=t2), the charges injected into FD 5 are displaced and the potential at point A is clamped to reference potential $V_{REF}$. When reset pulse $\phi 3$ becomes low (t=t3), reset occurs at point A, clamp pulse $\phi 1$ goes from high to low (t=t4), and a signal component with such reset noise superimposed thereon appears at point A. The signal at point A is delayed via source follower 7 and LPF 8 to appear at points B and C. So long as clamp pulse $\phi 1$ is high (t3 to t4), the potential at point C is clamped to reference potential $V_{REF}$ and the reset noise level is so clamped. When S/H pulse $\phi 2$ becomes high (t=t4), signal components from which the reset noise is removed appear at the output and the signal level present when the pulse $\phi 2$ falls is held.

One drawback is that as shown in FIG. 3A, when the duty cycle of each pulse signals $\phi 1$, $\phi 2$ and $\phi 3$ is ⅓, noise which occurs due to rises and falls of other pulses and which is delayed by the LPF if likely to be superimposed on the he signal present during the S/H pulse, so that fixed pattern noise occurs. Another drawback is that as shown at ⑦ in FIG. 3A, the time T" during which a signal component occurs at the output $V_{OUT}$ is shorter than T'.

The method of driving the particular embodiment for eliminating such drawbacks will be described with respect to FIG. 3B. The particular embodiment is characterized in that the pulse width of the clamp, S/H and reset pulses $\phi 1$, $\phi 2$ and $\phi 3$ to drive the several elements of the output amplifier is equal to, or less than, ⅓ of the period of these pulses, as shown at ①, ② and ③ in FIG. 3B.

Thus, for example, while S/H pulse $\phi 2$ is low and sampling is not conducted, clamp pulse $\phi 1$ or reset pulse $\phi 3$ may fall or rise. Thus noise due to such fall or rise may be mixed in the output at points B and C in FIG. 2. Consequently, while the S/H pulse is high and sampling is being conducted, no noise due tot he rise and fall of clamp and reset pulses $\phi 1$ and $\phi 2$ will be mixed in the outputs at B and C points of FIG. 2 and fixed pattern noise is prevented from occurring.

Figure 3B:
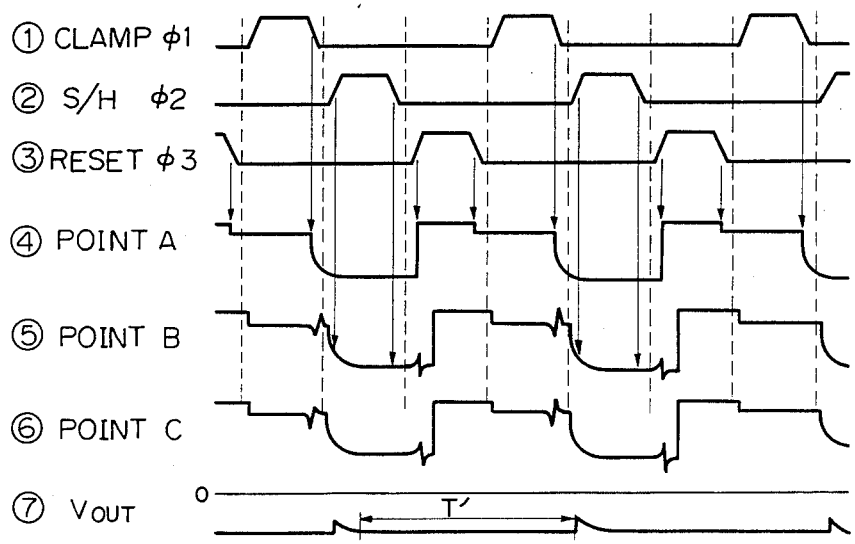
FIG. 3B is a timing chart showing the waveforms of pulses $\phi 1$, $\phi 2$ and $\phi 3$ according to one embodiment of the present invention for clamping, sampling and holding, and resetting purposes.

In addition, according to the particular embodiment, the time T' during when a signal component is occurring at the output $V_{OUT}$, as shown at ⑦ in FIG. 3B, is more than that shown at ⑦ in FIG. 3A.

A second embodiment of the present invention will be described with respect to FIG. 4 which is a block diagram of a frame transfer type CCD to which the present invention is applied.

Figure 4:
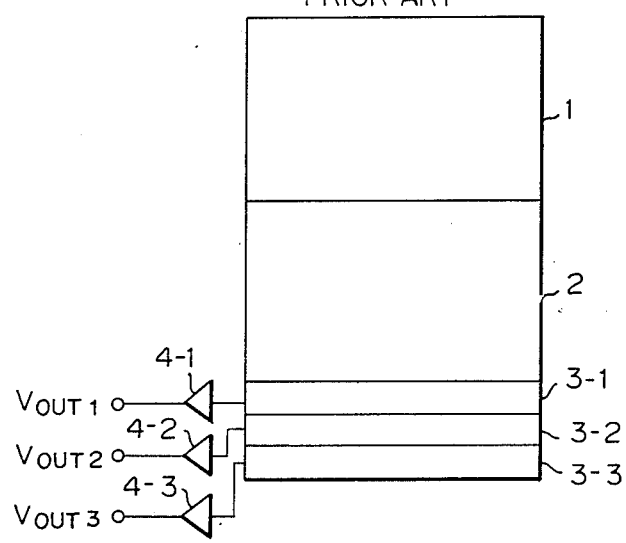
FIG. 4 is a block diagram showing the structure of a frame transfer-type CCD to which the present invention can also be applied.

Like reference numerals are used to denote like parts in FIGS. 1 and 4 and more detailed description of corresponding elements will be omitted. In FIG. 4, reference numerals 3-1, 3-2 3-3 denote horizontal registers which read signals in memory (storage) 2. The reason why the number of horizontal registers is three in the particular embodiment will be described next. An image pickup device such as that shown in FIG. 4 is constructed so as to provide a read out of a relatively large number (shown as three) horizontal lines at one, to improve the resolution. If the number of the horizontal lines read out at once increases, however, the number of horizontal registers to read the image signal will increase. On the other hand, the time required to read signals representative of images in a horizontal line is determined by a standard television signal. Thus the frequency of a clock signal to drive such horizontal registers will necessarily increase and thus the transfer efficiency will decrease.

Thus in the particular embodiment, three horizontal registers as shown by 3-1, 3-2 and 3-3, are provided so that each of the registers receives a corresponding ⅓ of the image signals in a horizontal line.

Reference numerals 4-1 to 4-3 denote the output amplifiers shown in FIG. 1, each of which is constructed as shown in FIG. 2.

Next, the relationship among these output amplifiers 4-1 to 4-3, horizontal registers 3-1 to 3-3, and pulses $\phi 1$, $\phi 2$ and $\phi 3$ applied to these elements will be described with respect to FIG. 5, in which a pulse generator 20 generates pulses $\phi 1$, $\phi 2$ and $\phi 3$ 120 degrees out of phase with one another and each having a pulse width less than ⅓ of its period.

Pulses $\phi 3$, $\phi 2$ and $\phi 1$ are applied to a reset signal terminal RESET, a S/H signal terminal S/H and a clamp signal terminal CLAMP, respectively, or output amplifier 4-1, and the pulse $\phi 1$ is also applied to horizontal shift register 3-1.

Pulses $\phi 1$, $\phi 3$ and $\phi 2$ are applied to a reset signal terminal RESET, a S/H signal terminal S/H and a clamp signal terminal CLAMP, respectively, of output amplifier 4-2, and the pulse $\phi 2$ is also applied to horizontal shift register 3-2.

Pulses $\phi 2$, $\phi 1$ and $\phi 3$ are applied to a reset signal terminal RESET, a S/H signal terminal S/H and a clamp signal terminal CLAMP of output amplifier 4-3, and the pulse $\phi 3$ is also applied to horizontal shift register 3-3.

Figure 5:
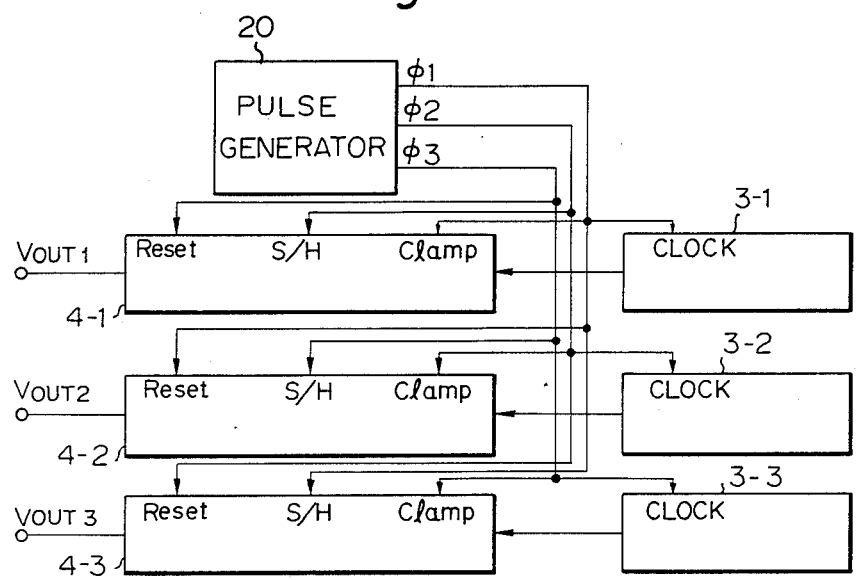
FIG. 5 is a block diagram showing the relationship between horizontal shift registers 3-1 to 3-3 and output amplifiers 4-1 to 4-3, as shown in FIG. 4, and pulses $\phi 1$, $\phi 2$ and $\phi 3$ for clampling, sampling and holding, and resetting purposes.

That is, in the particular embodiment shown in FIG. 5, the clock signals input to drive clock terminals CLOCK of the three horizontal shift registers 3-1 to 3-3 are the same in period and 120 degrees out of phase with one another, so that image signals are sequentially output from horizontal shift registers 3-1 to 3-3 to the corresponding output amplifiers 4-1 to 4-3.

Signals having the same period and 120 degrees out of phase with one another are also input to the reset signal terminals RESET, S/H signal terminals S/H and clamp signal terminals CLAMP of output amplifiers 4-1 to 4-3, as shown in FIG. 5.

Thus in the particular embodiment, only three different pulses are required to drive output amplifiers 4-1 to 4-3 and horizontal registers 3-1 to 3-3 and not other kinds of pulses are needed.

The present invention is also applicable to the image pick up device shown in FIGS. 4 and 5. Namely, pulses $\phi 1$, $\phi 2$ and $\phi 3$ generated by pulse generator 20 having the same period, are 120 degrees out of phase with one another and are each shorter in pulse width than ⅓ of the period. invention, a sample and hold pulse is shorter in width than ⅓ of its period, so that noise due to other pulses is prevented from being mixed in the signals.

What is claimed is:

1. An image pickup device comprising:
   an image pickup means having three output channels for reading out an image signal output from said image pickup means, each of said output channels having clamp means, sample-and-hold means and reset means; and
   a drive signal source for generating three different cyclical pulses to clamp, sample and hold, and reset the image signal read out from said image pickup means, said three different cyclical pulses being substantially 120 degrees out of phase with one another, having the same period as each other, and having the same pulse width less than ⅓ of the period, wherein said drive signal source drives said three output channels using said three pulses.

2. An image pickup device according to claim 1, wherein said three output channels each include a charge transfer channel.

3. An image pickup device according to claim 1, wherein each of said three output channels read out a corresponding ⅓ of the image signal output from said image pickup means.

4. An image pickup device comprising:
   An image pickup means; and
   drive means for reading out three different kinds of image signals from said image pickup means using three kinds of cyclical transfer pulses substantially 120 degrees out of phase with one another, having the same period as each other, and having the same pulse width less than ⅓ of the period, each kind of said three kinds of cyclical pulses being used as a timing signal to sample and hold a different one of said three kinds of image signals.

5. An image pickup device according to claim 4, wherein said drive means comprises three output channels for respectively outputting said three different kinds of image signals using said three kinds of cyclical transfer pulses.

6. An image pickup device according to claim 5, wherein said three output channels each include a charge transfer channel.

7. An image pickup device according to claim 4, further comprising means for clamping each of said three kinds of image signals read out by said drive means.

8. An image pickup device according to claim 7, further comprising sample-and-hold means for sampling and holding each of said three kinds of image signals clamped by said clamping means.

9. An image pickup device according to claim 8, further comprising means for resetting each of said three kinds of image signals read out by said drive means.

10. An image pickup device comprising:
   (a) image sensor means for receiving light to convert the light to an electrical image signal;
   (b) three read means for respectively reading out different parts of the electrical image signal;
   (c) drive means for driving said three read means with three kinds of cyclical read pulses having the same pulse width and the same period and being substantially 120 degrees out of phase with one another;
   (d) clamp means for clamping each of said different parts of the electrical image signal read out by respective ones of said read means;
   (e) sample-and-hold means for sampling and holding the different parts clamped by said clamp means;
   (f) reset means for resetting the different parts read out by said three read means; and
   (g) connection means for supplying said three kinds of cyclical read pulses from said drive means to said clamp means, said sample-and-hold means and said reset means to drive said clamp means, said sample-and-hold means and said reset means;
   wherein the width of said read pulses is less than ⅓ of the period.

11. An image pickup device according to claim 10, wherein said clamp means clamps the different parts read out by said respective read means 120 degrees out of phase with one another using respective ones of said read pulses.

12. An image pickup device according to claim 11, wherein said sample-and-hold means samples and holds the different parts clamped by said clamp means.

13. An image pickup device according to claim 10, wherein said reset means resets said different parts read out by said three read means 120 degrees out of phase with one another.

14. An image pickup device comprising:
   (a) image sensor means for receiving light to convert the light to an electrical image signal;
   (b) first, second and third read means for respectively reading out different parts of the electrical image signal;
   (c) drive means for driving said first, second and third read means with first, second and third cyclical read pulses having the same pulse width and the same period, and being substantially 120 degrees out of phase with one another, wherein the pulse width of the first, second and third cyclical read pulses is less than ⅓ of said period;
   (d) first clamp means for clamping the part read out by said first read means, said first clamp means being driven by the first cyclical read pulse;
   (e) first sample-and-hold means for sampling and holding the part clamped by said first clamp means, said first sample-and-hold means being driven by the second cyclical read pulse;
   (f) first reset means for resetting the part read out by said first read means, said first reset means being driven by the third cyclical read pulse;
   (g) second clamp means for clamping the part read out by said second read means, said second clamp means being driven by the second cyclical read pulse;
   (h) second sample-and-hold means for sampling and holding the part clamped by said second clamp means, said second sample-and-hold means being driven by the third cyclical read pulse;
   (i) second reset means for resetting the part read out by said second read means, said second reset means being driven by the first cyclical read pulse;
   (j) third clamp means for clamping the part read out by said third means, said third clamp means being driven by the third cyclical read pulse;
   (k) third sample-and-hold means for sampling and holding the part clamped by said third clamp means, said third sample and hold means being driven by the first cyclical read pulse; and
   (l) third reset means for resetting the part read out by said third read means, said third reset means being driven by the second cyclical read pulse.

* * * * *

UNITED STATES PATENT AND TRADEMARK OFFICE
CERTIFICATE OF CORRECTION

PATENT NO. : 4,857,996
DATED : August 15, 1989
INVENTOR(S) : YOSHIAKI HIRANO, ET AL.

Page 1 of 2

It is certified that error appears in the above-identified patent and that said Letters Patent is hereby corrected as shown below:

COLUMN 1

Line 40, "a" should read --an--.
Line 42, "pulses" should read --pulses,--.

COLUMN 2

Line 2, "purposes." should read --purposes;--.
Line 9, "clampling," should read --clamping,--.
Line 38, "FET 7" should read --FET 7,--.
Line 40, "substrate)" should read --substrate),--.
Line 44, "int he" should read --in the--.
Line 48, "FET 11" should read --FET 11,--.
Line 54, "FET 14" should read --FET 14,--.
Line 55, "source" (first occurrence) should read --source,--.
Line 59, "clamp pulse $\phi 2$" should read --clamp pulse $\phi 1$--.

COLUMN 3

Line 16, "each" should read --each of--.
Line 18, "if" should read --is--.
Line 19, "he" should be deleted.
Line 37, "tot he" should read --to the--.
Line 44, "FIG. 3A." should read --FIG. 3A. Thus an image signal having a good S/N ratio results.--.
Line 52, "numerals 3-1, 3-2 3-3" should read --numerals 3-1, 3-2 and 3-3--.
Line 58, "one," should read --once,--.

UNITED STATES PATENT AND TRADEMARK OFFICE
CERTIFICATE OF CORRECTION

PATENT NO. : 4,857,996
DATED : August 15, 1989
INVENTOR(S) : YOSHIAKI HIRANO, ET AL.

It is certified that error appears in the above-identified patent and that said Letters Patent is hereby corrected as shown below:

COLUMN 4

Line 15, "or" should read --of--.
Line 43, "not" should read --no--.
Line 46, "pick up device" should read --pickup device--.
Line 50, "period. invention," should read --period. ¶ As described above, according to the present invention,--.
Line 52, "mixed in" should read --mixed into--.

COLUMN 5

Line 9, "An" should read --an--.

COLUMN 6

Line 52, "third means," should read --third read means,--.

Signed and Sealed this

Twelfth Day of June, 1990

*Attest:*

HARRY F. MANBECK, JR.

*Attesting Officer*     *Commissioner of Patents and Trademarks*